(12) United States Patent
Brannon et al.

(10) Patent No.: US 9,184,756 B2
(45) Date of Patent: Nov. 10, 2015

(54) VARIABLE DYNAMIC RANGE RECEIVER

(75) Inventors: Joseph Bradford Brannon, Greensboro, NC (US); David Hall Robertson, Boxford, MA (US); James C. Camp, Greensboro, NC (US); Carroll C. Speir, Pleasant Garden, NC (US)

(73) Assignee: ANALOG DEVICES, INC., Norwood, MA (US)

( * ) Notice: Subject to any disclaimer, the term of this patent is extended or adjusted under 35 U.S.C. 154(b) by 821 days.

(21) Appl. No.: 12/941,361

(22) Filed: Nov. 8, 2010

(65) Prior Publication Data

US 2012/0114077 A1    May 10, 2012

(51) Int. Cl.
*H03K 9/00* (2006.01)
*H04L 27/00* (2006.01)
*H03M 1/06* (2006.01)
*H03M 1/12* (2006.01)
*H03M 1/66* (2006.01)
*H04B 1/00* (2006.01)

(52) U.S. Cl.
CPC .............. *H03M 1/0614* (2013.01); *H03M 1/12* (2013.01); *H03M 1/66* (2013.01); *H04B 1/001* (2013.01); *H04B 1/0035* (2013.01)

(58) Field of Classification Search
USPC ........................................... 341/155; 375/316
See application file for complete search history.

(56) References Cited

U.S. PATENT DOCUMENTS

| | | | | |
|---|---|---|---|---|
| 6,538,592 | B1* | 3/2003 | Yang et al. | 341/155 |
| 7,003,271 | B2* | 2/2006 | Kluge et al. | 455/240.1 |
| 2001/0054974 | A1* | 12/2001 | Wright | 341/144 |
| 2004/0162043 | A1 | 8/2004 | Taubenheim et al. | |
| 2005/0163251 | A1 | 7/2005 | McCallister | |
| 2007/0080843 | A1* | 4/2007 | Lee et al. | 341/155 |
| 2007/0103357 | A1 | 5/2007 | Alfano et al. | |
| 2009/0161802 | A1* | 6/2009 | Malla et al. | 375/345 |
| 2009/0207936 | A1* | 8/2009 | Behzad | 375/296 |

OTHER PUBLICATIONS

International Search Report and Written Opinion dated Jan. 30, 2012, from counterpart international application No. PCT/US2011/057462.
Analog Devices, Inc., "Quad IF Receiver", AD6657 Data Sheet, Rev. 0, Oct. 2009.
Analog Devices, Inc., "IF Diversity Receiver", AD6655 Data Sheet, Rev. A, Sep. 2009.

* cited by examiner

*Primary Examiner* — Nader Bolourchi
(74) *Attorney, Agent, or Firm* — Kenyon & Kenyon LLP

(57) ABSTRACT

Embodiments of the present invention may provide a signal processing circuit that may comprises an analog-to-digital converter (ADC), and an output restriction circuit. The output restriction circuit may reduce the accuracy of the digital output of the ADC when signal content exceeds a pre-determined spectrum mask in an undesirable band. In one embodiment, the input signal spectrum may be actively monitored and when the input spectrum is inconsistent with an intended application, the output resolution may be restricted, for example, by truncating least significant bits (LSBs) of the digital output or adding digital noise.

32 Claims, 8 Drawing Sheets

100

VARIABLE DYNAMIC RANGE RECEIVER

FIELD OF INVENTION

The present invention relates to signal receivers, and more particularly to a receiver that limits the signal accuracy based on instantaneous bandwidth and dynamic range of the input signal.

BACKGROUND

Wireless standards continue to push state of the art in core ADC performance for signal receivers. There is a clear trend for lower noise floor, and higher resolution and accuracy for the ADC output signals. However, in many applications, a full resolution and maximum accuracy of the signal is only required for the desirable band(s). To limit the output resolution and accuracy in undesirable signal bands, a variety of implementations have been carried out in the industry, for example, digital filtering by applying a transfer function to the digital out of the ADC, or noise shaping by dithering at a lower level in frequency bands at which noise is perceived to be more undesirable and at a relatively higher level in bands where it is perceived to be less undesirable.

The present technology has severe limitations. For example, both digital filtering and noise shaping artificially limit the available bandwidth of the signal. Therefore, there is a need in the art for providing a signal receiver with the maximum bandwidth that can selectively limit the output to have a full resolution and maximum accuracy for targeted applications.

DETAILED DESCRIPTION

Embodiments of the present invention may provide a signal processing circuit that may include an analog-to-digital converter (ADC), and an output restriction circuit. The output restriction circuit may reduce the accuracy of the digital output of the ADC when signal content exceeds a pre-determined spectrum mask in an undesirable band. In one embodiment, the input signal spectrum may be actively monitored and when the input spectrum is inconsistent with an intended application, the output resolution may be restricted, for example, by truncating least significant bits (LSBs) of the digital output.

Embodiments of the present invention may allow for maximum dynamic range over limited bandwidth while maintaining required sensitivity over the full range. One exemplary method may provide maximum bandwidth while selectively limiting the resolution to that required for specific application(s). In one embodiment, a signal processor may limit the dynamic range (e.g., accuracy and resolution) of a receiver based on the instantaneous bandwidth and input voltage range of the input signal.

Embodiments of the present invention may be applied in a variety of telecommunications applications that require maximum bandwidth but not necessarily maximum dynamic range for all conditions. For example, one exemplary embodiment may be applied in the observation path of a digital pre-distortion receiver, in which bandwidth may be the primary concern and resolution may be secondary. Other telecommunications applications are also possible by defining application specific bandwidth and dynamic range performance masks. Certain programmable features may be included that allow multiple spectral profiles, tunable profiles to allow frequency agility, and various external control signals to control functionality.

Figure 1:
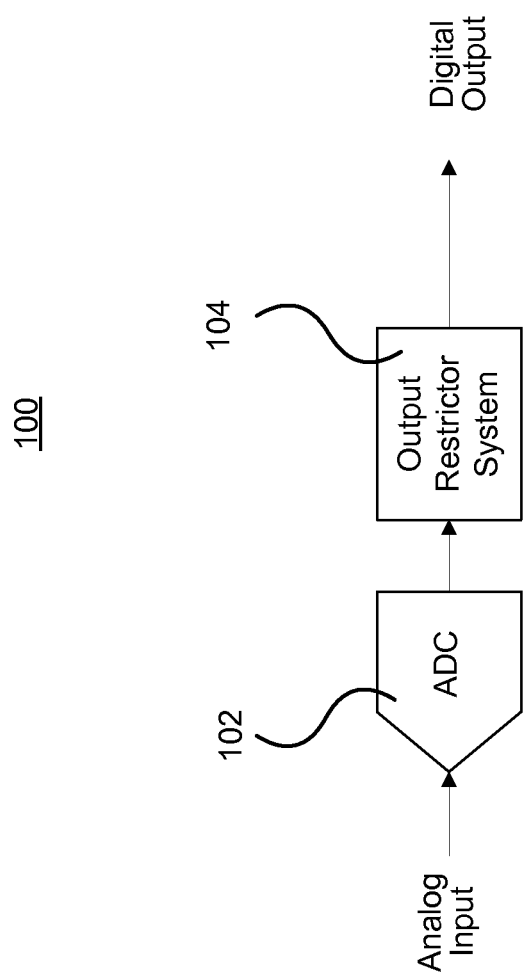
FIG. 1 illustrates an embodiment of a signal processor according to the present invention.

FIG. 1 illustrates an embodiment of a signal processor 100 according to the present invention. The signal processor 100 may comprise an analog-to-digital converter (ADC) 102 and an output restrictor system 104. The ADC 102 may receive an analog signal and digitize the analog signal into a digital signal. The output restrictor system 104 may receive the digital signal and, restrict the resolution and/or accuracy of the output signal based on the signal content. In one embodiment, the output restriction may be implemented by adjusting signal resolution and implemented as a semiconductor intellectual property (IP) core. The adjustable signal resolution may be referred to as variable dynamic range and accordingly, the output restriction functional block 104 may be referred to as a variable dynamic range IP.

The signal processor 100 according to the present invention may be used in transmission and/or receiving path. In one embodiment, the signal processor 100 may be used according to time division between transmit and receive mode. In another embodiment, the signal processor 100 may be used in an observation path of a digital pre-distortion receiver. In yet another embodiment, the signal processor 100 may be combined with either a Digital Drop Receiver of Noise Shape Requanitzer to form a multi-mode receiver that accommodates the required functionality of a complete receive function.

Figure 2:
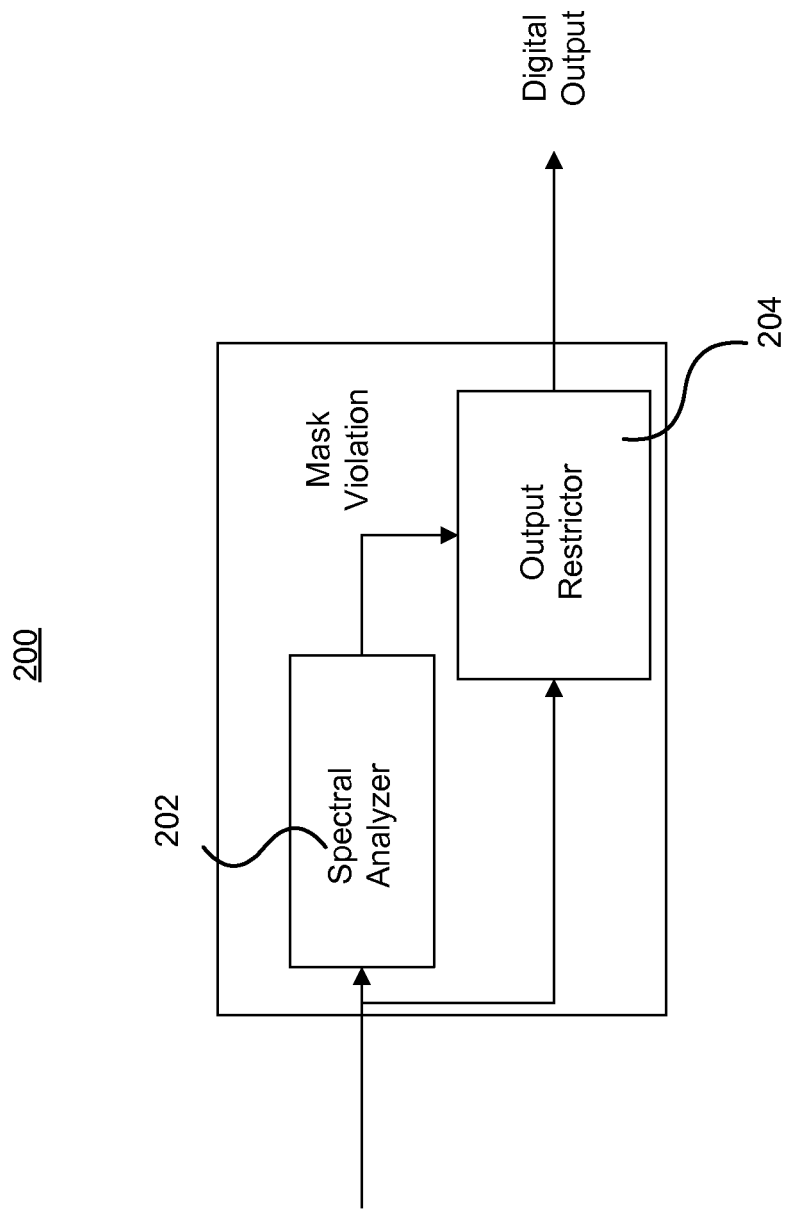
FIG. 2 illustrates an output restriction functional block according to an embodiment of the present invention.

FIG. 2 illustrates a block diagram of the output restrictor system 200 according to an embodiment of the present invention. As shown in FIG. 2, the output restrictor system 200 may comprise a spectral analyzer 202 and an output restrictor 204. The spectral analyzer 202 may receive the digital output from a preceding ADC (e.g., the ADC 102) with full resolution and accuracy the ADC may provide and then, compare the digital signal to a spectrum mask. For signal content in any undesirable bands, the spectral analyzer 202 may determine whether the signal content exceeds a pre-determined level defined in the spectrum mask. If yes, the spectral analyzer 202 may send a mask violation signal to the output restrictor 204. If no, the spectral analyzer 202 will not send a mask violation signal to the output restrictor 204. The output restrictor 204 may restrict the output signal's resolution and accuracy for the violated signal content in the undesirable bands upon receipt of the mask violation signal. In one embodiment, the spectrum mask may be stored in a register or a plurality of registers of the output restrictor system 200.

In one embodiment, the spectral analyzer 202 may monitor the signal content passively. The spectral analyzer 202 may be implemented in any manner on a monitoring path to accurately monitor the signal without concern for overall fidelity. Accordingly, the spectral analyzer 202 may be implemented in a filter and the filter implementation may focus on speed of detection and overall low power implementation instead of flatness and fidelity.

In some embodiments, in addition to the mask violation signal, a secondary output may be generated to indicate whether the input analog signal has exceeded the ADC's input range. The secondary output may be generated by the preceding ADC and used by the output restrictor block 204 but may also be passed to the outside of the device as an indication that the input signal has clipped the ADC.

Figure 3:
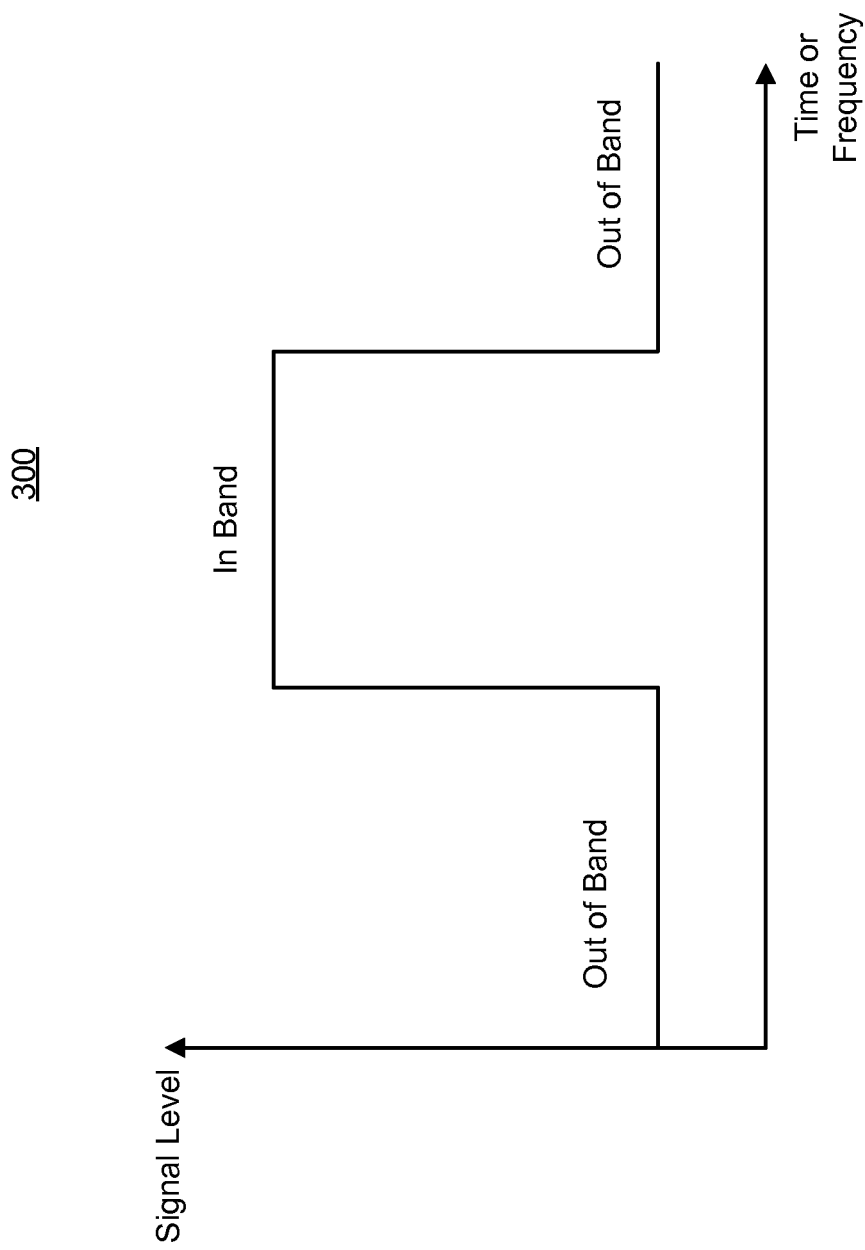
FIG. 3 illustrates a spectrum mask according to an embodiment of the present invention.

FIG. 3 illustrates a spectrum mask 300 according to an embodiment of the present invention. The spectrum mask 300 may comprise an in band region and one or more out of band regions (two shown in FIG. 3). The in band region may represent a desirable band and the two out of band regions may represent undesirable bands. The spectral analyzer 202 may use the spectrum mask 300 to determine whether the signal content is within the desirable band or undesirable bands. Further, if the signal content is within the undesirable bands, the spectral analyzer 202 may determine whether the signal content's level exceeds the mask and send out the mask violation signal as shown in FIG. 2 if yes.

In one embodiment, the spectrum mask 300 may be adjustable. For example, not all customers use the same frequency plans, thus, the spectrum mask may be tuned according to customer needs. That is, the in band and out of band regions may be configured or tuned according to customer's requirements. In one embodiment, a plurality of spectrum mask configurations may be pre-determined and the customers may select an applicable spectrum mask from the pre-determined configurations. In another embodiment, the spectrum mask may have more flexibility to allow customer to program the desirable and undesirable bands. In some embodiments, different groups of spectrum masks may be designed for time division between transmit and receive mode of operations. In those embodiments that mask needs to be selected, the selection may be made synchronous with the modes of the operation and may allow different defined spectral masks to be used during each of these operations. As described above, the spectrum mask 300 may be stored in one or more registers of an output restrictor system according to embodiments of the present invention.

In one embodiment, the spectrum mask 300 may be implemented in frequency domain and the spectral analyzer 202 may compare the digitized signal in the frequency domain. In another embodiment, the spectrum mask may be implemented in time domain and the spectral analyzer 202 may compare the digitized signal in the time domain.

Figure 4:
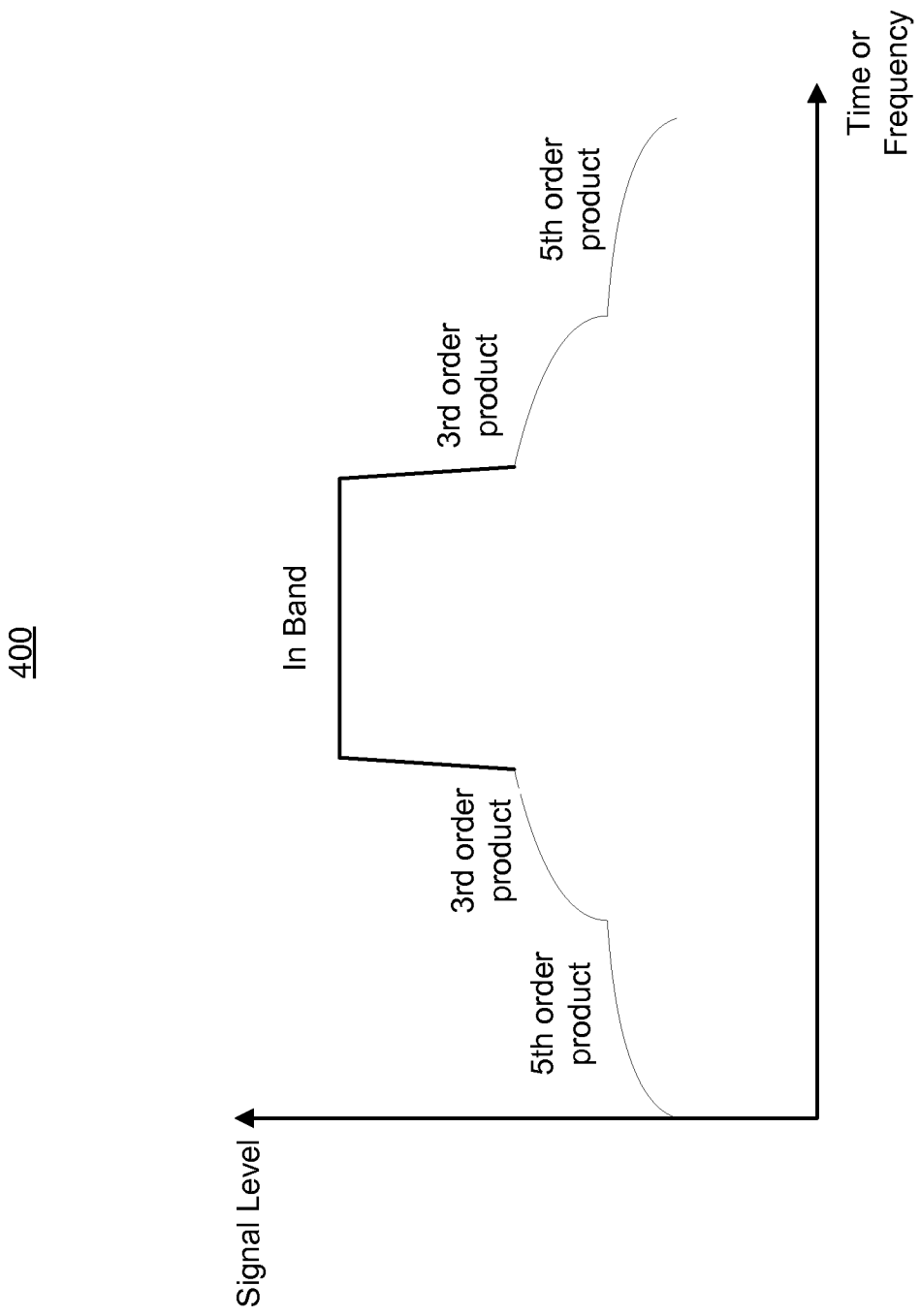
FIG. 4 illustrates a spectrum mask for a particular application according to an embodiment of the present invention.

FIG. 4 illustrates a spectrum mask for a particular application according to an embodiment of the present invention. Because of non-linear behavior of the analog components, intermodulation may introduce $3^{rd}$ and/or $5^{th}$ order intermodulation products. Accordingly, the out of band regions of FIG. 3 may take these $3^{rd}$ and/or $5^{th}$ order products into account. Therefore, instead of flat mask level, the out of band regions have curved mask level that may accommodate the $3^{rd}$ and or $5^{th}$ order terms.

It should be noted that although the spectrum masks of FIGS. 3 and 4 show that the in band regions may also have a signal level threshold, the spectral analyzer does not care about the in band region and may only apply the masks for the out of band regions. Therefore, in the in band region, the full resolution and converter input range of the ADC may be utilized and thus, in the in band region, a signal processor (e.g., the signal processor 100) according to the present invention may have a full dynamic range.

Figure 5:
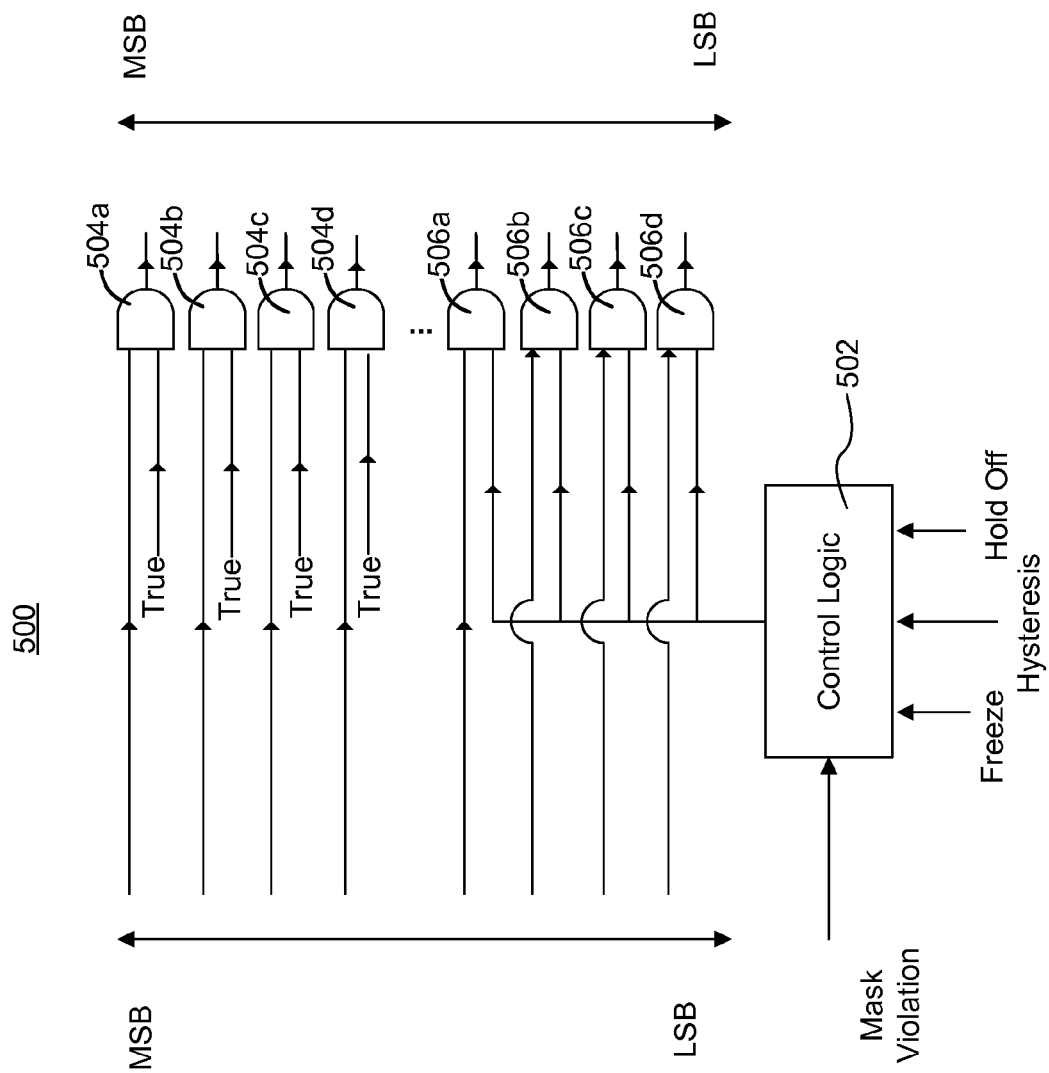
FIG. 5 illustrates an output restrictor according to an embodiment of the present invention.

FIG. 5 illustrates an output restrictor 500 according to an embodiment of the present invention. The output restrictor 500 may determine when the dynamic range of the output signal of an ADC may be reduced. The output restrictor 500 may comprise a control logic block 502 and a plurality of AND gates 504 and 506. The plurality of AND gates 504 and 506 may each have one input coupled to the digital output from an ADC (e.g., the ADC 102 as shown in FIG. 1). As shown in the FIG. 5, each of the AND gates 504 may have an input coupled to the ADC's digital output from the most significant bit (MSB) towards the least significant bit (LSB) and each of the AND gates 506 may have an input coupled to the ADC's digital output from the LSB towards the MSB. A second input of each of the AND gates 504 may be coupled to a "true" signal and a second input of each of the AND gates 506 may be coupled to an output of the control logic block 502. In one embodiment, the total number of the AND gates 504 and 506 may be the number of bits of the output of the ADC.

The control logic block 502 may receive a mask violation signal and several control signals, for example, freeze, hold off and hysteresis. The mask violation signal may be an indicator from a spectral analyzer (e.g., the spectral analyzer 202 as shown in FIG. 2) to indicate that the signal content of the ADC's digital output may have exceeded the spectrum mask in an undesirable signal band (e.g., an out of band region as shown in FIG. 3 or 4). In one embodiment, when the signal content exceeds the spectrum mask in an undesirable signal band, the control logic block 502 may generate a false signal to the second inputs of the AND gates 506 to force the AND gates 506 to truncate the digital output. Thus, the resolution of the digital output may be effectively reduced by the number of the AND gates 506. In one embodiment, the number of the AND gates 506, hence the number of bits that may be truncated may be predetermined according to design specification. In another embodiment, the number of the AND gates 506 programmable. That is, the number of the AND gates 506 may be adjusted according to customer needs.

The external control signals may apply external controls to the control logic block 502, for example, to delay or even stop the truncating the digital output even when the signal content may have exceeded the spectrum mask in out of band regions. In some embodiments, the hold off signal may be applied to the control logic block 502 to delay the onset of reduction of the resolution by a limited number of clock cycles. For example, a random event may occur or a sudden peak may occur and it is unimportant, in such situations only a few samples may exceed the spectral mask in undesirable region(s) and allowing a delay in onset may be advantageous in these and other applications. In one embodiment, the number of clock cycles and/or number of samples to hold off may be user selectable, by the user setting a predetermined number of samples of the digital signal, or tied to some known characteristics of the desired signal.

In one embodiment, once the output bits of the digital output has been truncated, it may be desirable to keep the resolution reduced for a period of time after the input signal has returned to normal. The hysteresis external signal may be used to implement this functionality. This external control may be important to some applications where the input spectrum is border-line and would otherwise alternate between within and outside the defined mask. By providing hysteresis, return to full resolution can be delayed until it is certain that the input spectrum is stable.

In one or more embodiments, the external circuitry may wish to control when the resolution returns to normal by using an external control freeze signal. In these embodiments, the control logic block 502 may determine when the bit truncation may be started. However, terminating the bit truncation (e.g., returning to full resolution) may be contingent on both the input signal returning to normal and the freeze signal being released by the external process.

Figure 6:
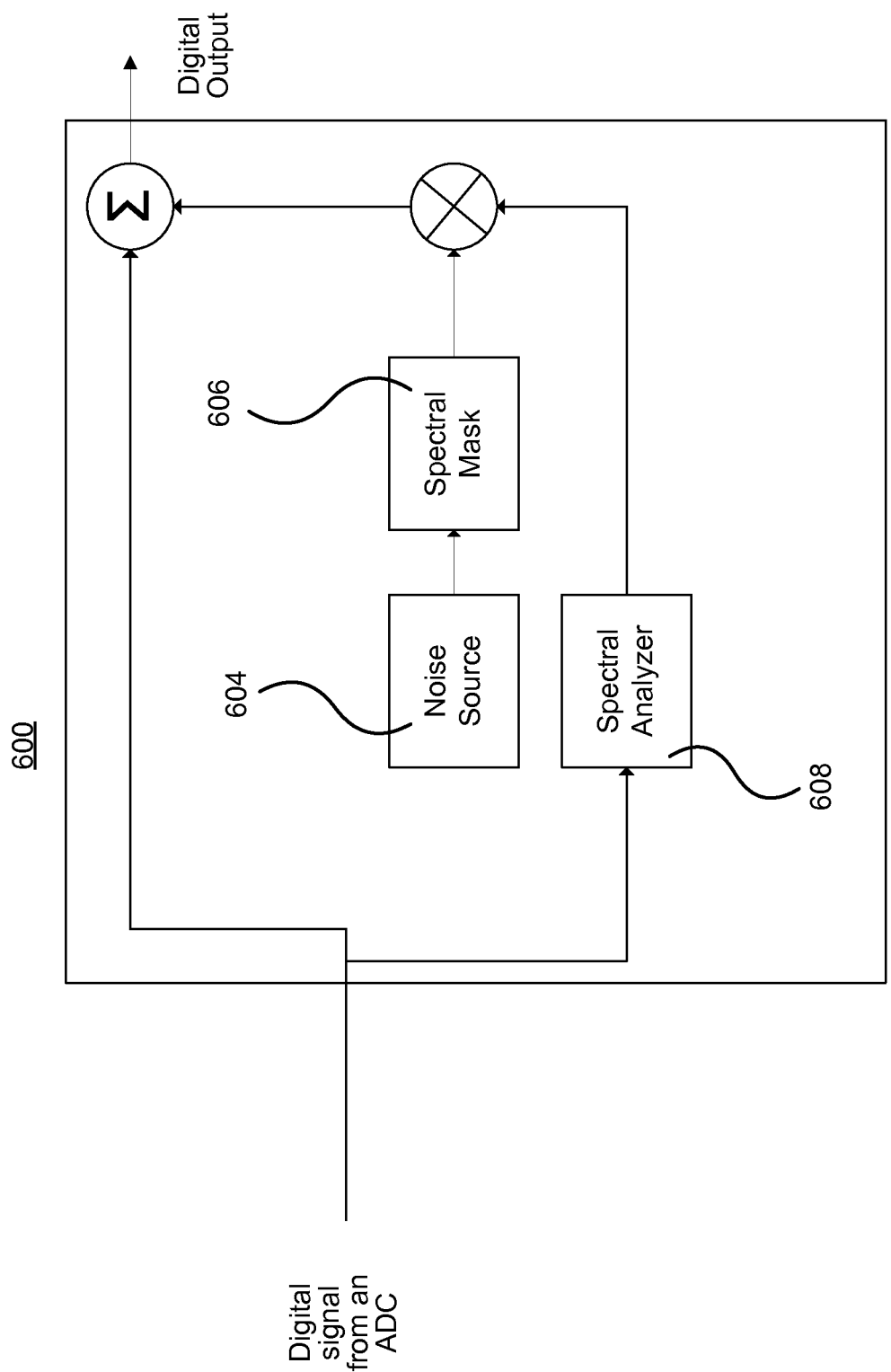
FIG. 6 illustrates another embodiment of an output restriction functional block according to the present invention.

The reduction of the dynamic range may be accomplished in a number of ways depending on the requirements of the application. FIG. 6 illustrates another embodiment of an output restrictor system 600 according to the present invention. The output restrictor system 600 may comprise a noise source 604, a spectral analyzer 608 and a spectral mask 606. The output restriction functional block 600 may receive a digital signal from an ADC output and generate a digital output that reduces the accuracy in the out of band regions if the signal content exceeds a predetermined spectrum mask. The spectral analyzer 608 may use a spectrum mask as described above (e.g., the spectrum masks shown in FIGS. 3-4). However, instead of generating a mask violation signal, the spectral analyzer 608 may generate a digital word representing how much the signal content is exceeding the mask in an out of band region. In one embodiment, the amount of the signal content that exceeds the mask may be measured by a root mean squared level or a peak level.

The noise source 604 may generate a digital noise. When the signal content exceeds the mask in an out of band region, the digital noise may be added into the received digital signal at a summation block to limit the accuracy of the output signal. The spectral mask 606 may be the same mask used by the spectral analyzer 608. The spectral mask 606 may limit the digital noise to be only added in an out of band region when a violating signal is present. The digital noise may be amplified according to the digital word generated by the spectral analyzer 608. Therefore, the amount of noise added may be the same amount that the signal content exceeds the mask in the out of band region. In one embodiment, the spectral mask 606 may be optional and the noise may be added in both in band and out of band regions.

Figure 7:
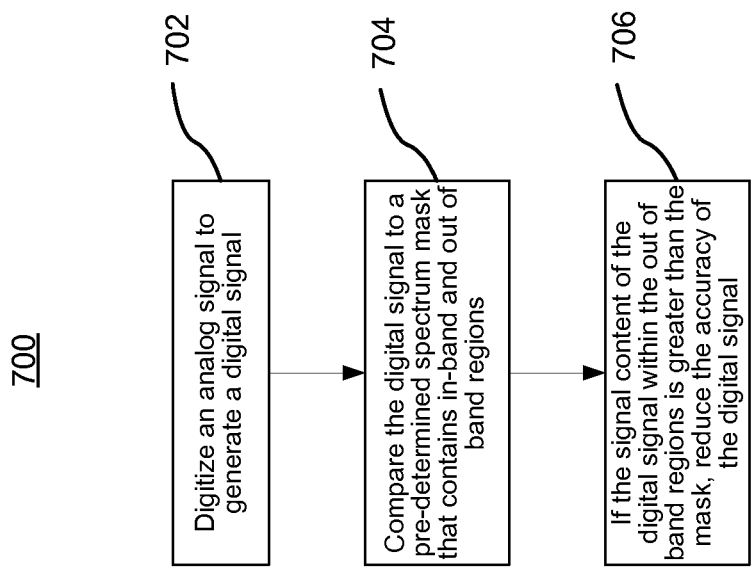
FIG. 7 illustrates a flowchart depicting a process to reduce accuracy of an output signal according to an embodiment of the present invention.

FIG. 7 illustrates a flowchart depicting a process 700 to reduce accuracy of an output signal according to an embodiment of the present invention. The process 700 may start from step 702. At step 702, an analog signal may be digitized to generate a digital signal. For example, as shown in FIG. 1, the ADC 102 of the signal processor 100 may digitize an analog input signal to generate a digital signal. At step 704, the digital signal may be compared to a pre-determined spectrum that contains in-band and out of band regions. As described above, a spectral analyzer according to an embodiment of the present invention may compare the digital signal to a pre-determined spectrum mask. In particular, the spectral analyzer may compare the signal content in the out of band regions to the mask to determine whether the signal content of the digital signal within the out of band regions is greater than the mask. At step 706, if the signal content of the digital signal within the out of band regions is greater than the mask, the accuracy of the digital signal may be reduced, for example, by bit truncating or adding digital noise as described above.

Figure 8:
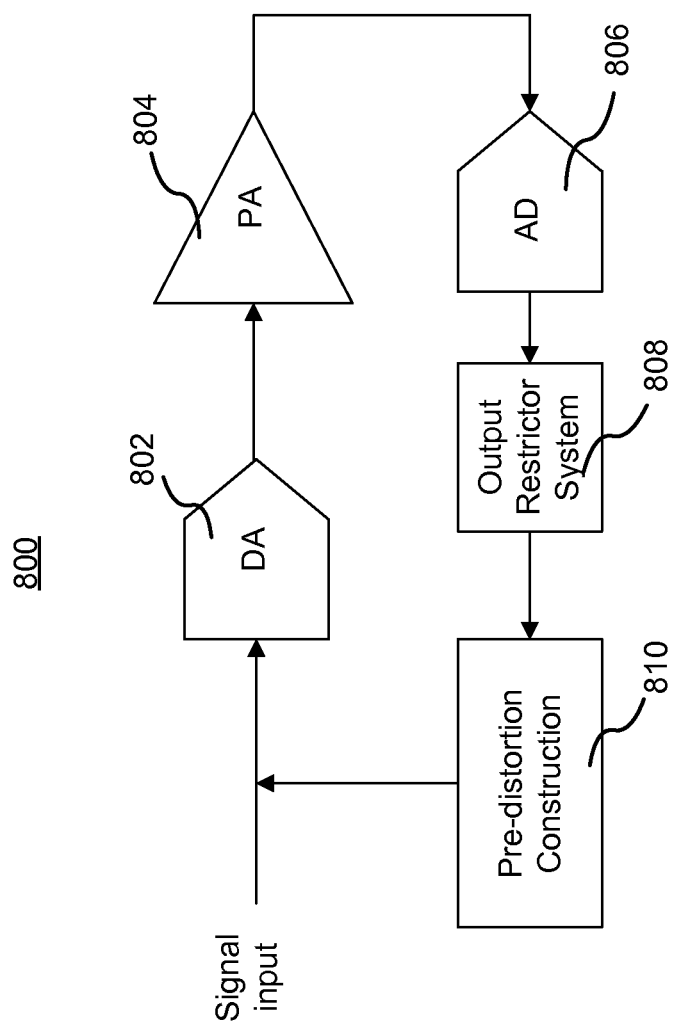
FIG. 8 illustrates a pre-distortion power amplifier according to an embodiment of the present invention.

FIG. 8 illustrates a pre-distortion power amplifier (PA) 800 according to an embodiment of the present invention. PAs have been used extensively in mobile base transceiver stations for amplifying weak signals without adding distortion. To compensate for the non-linearity of the power amplifiers, the input signal may be pre-distorted by adding a pre-distortion. The signal processor 100 of the present invention may be applied in a pre-distortion power amplifier 800. The pre-distortion power amplifier 800 may comprise a digital to analog (DA) converter 802, a power amplifier 804, an analog to digital (AD) converter 806, an output restrictor system 808 and a pre-distortion construction unit 810. The DA converter 802 may convert a digital signal to an analog signal. The digital signal may be an input signal distorted by a pre-distortion generated by the pre-distortion construction unit 810. The power amplifier 804 may amplify the converted analog signal. The amplified signal may be fed to the AD converter 806. The output of the AD converter 806 may be limited by the output restrictor system 808 as described above based on comparison of signal content to pre-determined spectrum masks. The digital output may be coupled to the pre-distortion construction unit 810 to generate the pre-distortion. Therefore, in the pre-distortion power amplifier 800, the output restrictor system 808 may be applied in an observation path. It should be noted that in other embodiments according to the present invention, the output restriction block may be applied in the main transmission and/or receiving path.

Several embodiments of the present invention are specifically illustrated and described herein. However, it will be appreciated that modifications and variations of the present invention are covered by the above teachings and within the purview of the appended claims without departing from the spirit and intended scope of the invention.

It should be understood that there exist implementations of other variations and modifications of the invention and its various aspects, as may be readily apparent to those of ordinary skill in the art, and that the invention is not limited by specific embodiments described herein. Features and embodiments described above may be combined. It is therefore contemplated to cover any and all modifications, variations, combinations or equivalents that fall within the scope of the basic underlying principals disclosed and claimed herein.

We claim:

1. A signal processing circuit, comprising:
   an analog-to-digital converter (ADC) receiving an analog signal and providing a digital signal, and
   an output restriction circuit:
      receiving the digital signal from the ADC;
      having a pre-determined spectral mask defining an in-band region and an out of band region of the digital signal; and
      adjusting a resolution of the digital signal while providing a maximum bandwidth of the digital signal by:
         providing a full resolution of the in band region of the digital signal and
         restricting a resolution of the out of band region of the digital signal by reducing a content level of the digital signal in the out of band region when the content level of the digital signal exceeds a level defined in the pre-determined spectral mask in the out of band region.

2. The signal processing circuit of claim 1, wherein the output restriction circuit further comprises a spectral analyzer to compare the content level of the digital signal to the level defined in the pre-determined spectral mask, the spectral analyzer generates a mask violation signal when the content level of the digital signal exceeds the level defined in the pre-determined spectral mask in the out of band region.

3. The signal processing circuit of claim 2, wherein the output restriction circuit further comprises an output restrictor coupled to an output of the spectral analyzer, the output restrictor is to restrict the resolution by reducing the content level of the digital signal in the out of band region when receiving the mask violation signal.

4. The signal processing circuit of claim 3, wherein the output restrictor comprises a control logic that truncates bits at the least significant bit (LSB) end of the digital signal to restrict the resolution of the digital signal.

5. The signal processing circuit of claim 4, wherein the control logic is coupled to an external hold off control signal, the hold off control signal is to delay the onset of bit truncation by a limited number of clock cycles when only a predetermined number of samples of the content level of the digital signal exceeds the level defined in the pre-determined spectral mask in the out of band region.

6. The signal processing circuit of claim 4, wherein the control logic is coupled to an external hysteresis control signal to keep the bit truncation for a period of time after an input signal has returned to normal.

7. The signal processing circuit of claim 4, wherein the control logic is coupled to an external freeze control signal, the bit truncation is to be terminated when an input signal returns to normal and the freeze signal is released.

8. The signal processing circuit of claim 1, wherein the pre-determined spectral mask is programmable.

9. The signal processing circuit of claim 1, wherein the pre-determined spectral mask is selected from a plurality of spectral masks fabricated to the output restriction circuit.

10. The signal processing circuit of claim 1, wherein the pre-determined spectral mask is defined in a frequency domain.

11. The signal processing circuit of claim 1, further comprising:
 a digital-to-analog converter (DAC);
 a power amplifier; and
 a pre-distortion construction unit, wherein the ADC and the output restriction circuit are chained between the power amplifier and the pre-distortion construction unit.

12. The signal processing circuit of claim 1, wherein the output restriction circuit further comprises a noise source and a spectral analyzer, the noise source generates a digital noise, and the spectral analyzer compares the content level of the digital signal to the level defined in the pre-determined spectral mask to determine how much of the content level of the digital signal exceeds the level defined in the pre-determined spectral mask in the out of band region and to have the same amount of digital noise added to the output.

13. A method to control the resolution of an output of an analog-to-digital converter (ADC), comprising:
 digitizing an analog input signal to the ADC to generate a digital signal; and
 adjusting a resolution of the digital signal while providing a maximum bandwidth of the digital signal based on a pre-determined spectral mask, the spectral mask defining an in band region and an out of band region of the digital signal, the resolution of the digital signal being adjusted by:
  providing a full resolution of the in band region of the digital signal; and
  restricting a resolution of the out of band region of the digital signal by reducing a content level of the digital signal in the out of band region when the content level of the digital signal exceeds a level defined in the pre-determined spectral mask in the out of band region, by an output restriction circuit.

14. The method of claim 13, wherein the output restriction circuit further comprises a spectral analyzer to compare the content level of the digital signal to the level defined in the pre-determined spectral mask, the spectral analyzer generates a mask violation signal when the content level of the digital signal exceeds the level defined in the pre-determined spectral mask in the out of band region.

15. The method of claim 14, wherein the output restriction circuit further comprises an output restrictor coupled to an output of the spectral analyzer, the output restrictor is to restrict the resolution by reducing the content level of the digital signal in the out of band region when receiving the mask violation signal.

16. The method of claim 15, wherein the output restrictor comprises a control logic that truncates bits at the least significant bit (LSB) end of the digital signal to restrict the resolution of the digital signal.

17. The method of claim 16, wherein the control logic is coupled to an external hold off control signal, the hold off control signal is to delay the onset of bit truncation by a limited number of clock cycles when only a pre-determined number of samples of the content level of the digital signal exceeds the level defined in the pre-determined spectral mask in the out of band region.

18. The method of claim 16, wherein the control logic is coupled to an external hysteresis control signal to keep the bit truncation for a period of time after an input signal has returned to normal.

19. The method of claim 16, wherein the control logic is coupled to an external freeze control signal, the bit truncation is to be terminated when input signal returns to normal and the freeze signal is released.

20. The method of claim 13, wherein the pre-determined spectral mask is programmable.

21. The method of claim 13, wherein the pre-determined spectral mask is selected from a plurality of spectral masks fabricated to the output restriction circuit.

22. The method of claim 13, wherein the pre-determined spectral mask is defined in a frequency domain.

23. The method of claim 13, wherein the ADC and the output restriction circuit are part of an observation path of a pre-distortion power amplifier.

24. The method of claim 13, wherein the resolution of the digital signal is restricted by measuring how much the content level of the digital signal exceeds the level defined in the pre-determined spectral mask in the out of band region and adding the same amount of digital noise.

25. A signal processing circuit, comprising:
 an analog-to-digital converter (ADC) to receive an analog input signal and output a digital signal, and
 an output restriction circuit coupled to the ADC, the output restriction circuit including a spectral analyzer to compare signal content of the digital signal to a pre-determined spectral mask that defines an in band region and an out of band region of the digital signal, wherein the output restriction circuit adjusts a resolution of the digital signal and provides a maximum bandwidth of the digital signal by:
  providing a full resolution of the in band region of the digital signal; and
  restricting a resolution of the out of band region of the digital signal by reducing a content level of the digital signal in the out of band region when the content level of the digital signal exceeds a level defined in the pre-determined spectral mask in the out of band region.

26. The signal processing circuit of claim 25, wherein the output restriction circuit further comprises an output restrictor coupled to an output of the spectral analyzer and restricts the resolution of the digital signal by truncating bits at the least significant bit (LSB) end of the digital signal.

27. The signal processing circuit of claim 25, wherein the output restriction circuit further comprises a noise source and the resolution of the digital signal is restricted by measuring how much the content level of the digital signal exceeds the level defined in the pre-determined spectral mask in the out of band region and adding the same amount of digital noise generated by the noise source.

28. The signal processing circuit of claim 1, wherein the pre-determined spectral mask defining an in band region and an out of band region is determined according to at least one of: (i) an application specific bandwidth, (ii) an instantaneous bandwidth and an input voltage range of an input signal, or (iii) a programmable feature.

29. The method of claim 13, wherein the pre-determined spectral mask defining an in band region and an out of band region is determined according to at least one of: (i) an application specific bandwidth, (ii) an instantaneous bandwidth and an input voltage range of an input signal, or (iii) a programmable feature.

30. The signal processing circuit of claim 25, wherein the predetermined spectral mask defining an in band region and an out of band region is determined according to at least one of: (i) an application specific bandwidth, (ii) an instantaneous bandwidth and an input voltage range of an input signal, or (iii) a programmable feature.

31. The signal processing circuit of claim 1, wherein the output restriction circuit restricts the resolution of the digital signal by truncating bits at the least significant bit (LSB) end of the digital signal in the out of band region.

32. The method of claim 13, wherein the output restriction circuit restricts the resolution of the digital signal by truncating bits at the least significant bit (LSB) end of the digital signal in the out of band region.

\* \* \* \* \*